INVENTORS
ROBERT H.F. LLOYD
STANLEY P. DAVIS
C. FRANK MYERS
BY Peter R. Leal
AGENT 3,560,277

PROCESS FOR MAKING SEMICONDUCTOR BODIES HAVING POWER CONNECTIONS INTERNAL THERETO

Robert H. F. Lloyd, Sunnyvale, and Stanley P. Davis, Cupertino, Calif., and Charles Frank Myers, Scottsdale, Ariz., assignors to International Business Machines Corporation, Armonk, N.Y., a corporation of New York Filed Jan. 15, 1968, Ser. No. 697,731
Int. Cl. H01l 7/36
U.S. Cl. 148—175 8 Claims

ABSTRACT OF THE DISCLOSURE

A process for making semiconductor bodies, said bodies having power connections and decoupling means internal thereto, said connections comprising diffused low resistance semiconductor regions, wherein said process comprises the steps of forming the low resistance regions and the decoupling means by a series of diffusions including controlled out-diffusions.

BACKGROUND OF THE INVENTION

This invention relates to a process for making integrated circuits. More particularly, this invention relates to a process for making power connections for an integrated circuit chip. The advent of dense, high speed integrated circuits has caused serious problems in the fabrication of power supply connections to integrated circuit chips. High circuit population and high circuit speed require DC and AC impedances of the supply lines which are diametrically opposed to the miniature chip lead connections necessary to fully realize the advantages of high circuit density. As circuit population density increases, the size of power contacts decreases, thus increasing the resistance of the power contacts and decreasing the amount of current which can flow through these contacts. The importance of low resistance power contacts has been realized in the past in the field of power transistors but has not been realized in the field of logic circuits due to the small amounts of currents formerly required. However, with the advent of high density integrated circuits, having many circuits on a single semiconductor chip, the power requirements begin to approach those of a power transistor environment, when viewed from the standpoint of attempting to conduct power supply current into the integrated circuit chip.

One prior art method used to overcome the above problem was the utilization of chip signal leads for supplying current from the power supply to the circuits on the chip. These leads are generally located on the perimeter of the integrated circuit chip. However, the perimeter of the chip is limited. This is because the area of the chip determines the number of circuits which can be fabricated on a chip. The area, of course, is proportional to the square of the chip dimension, whereas the perimeter varies linearly with the dimension. Therefore, as the chip becomes larger and larger, the perimeter becomes more and more precious. Hence the prior art solution of the power problem by using up these precious signal leads on the perimeter is in direct conflict with the necessity to use these leads for signal communication to the circuits on the chip.

A second problem arose with the advent of extremely high speed circuits on an integrated circuit chip. With switching time measured in nanoseconds, not only is the resistance of the power lead important, but the inductance of the power lead also becomes of high importance. This is because a high speed change of current across a power lead having a high inductance effectively blocks voltage across the lead. It is therefore of great importance to have a power lead of low inductance.

It has been found that the above problems of the prior art can be solved by providing a low inductance, low resistance diffused semiconductor collar, or sheet, surrounding an integrated circuit chip, and bonded to a planar common power supply contact at the bottom of the chip. Said collar provides conductive contact from the planar contact to the circuits on the top of said chip. A second power supply connection can be provided to an area of the top surface of the chip for connection to circuits thereon. Capacitor means internal to said chip are provided for decoupling said power supply connections.

However, the prior art processes generally available for fabricating an integrated circuit chip of the type described include process steps which fail to result in as low a source impedance and series inductance of the power supply connections commensurate with superior performance of the circuits. Furthermore, prior art processes for fabricating a circuit chip of the type described suffer from the inability of producing decoupling capacitance means of capacitance value commensurate with superior circuit performance.

It is an object of this invention to provide a new and useful process for making a semiconductor body.

It is a further object of this invention to provide a new and useful process for making a semiconductor integrated circuit chip having power connections and decoupling capacitance means internal thereto.

It is a more specific object of this invention to provide a new and useful process, including steps of controlled out-diffusion, for fabricating an integrated circuit chip having power connections displaying low source impedance at high frequencies and low series inductance, and also having decoupling means displaying high capacitance and a low series inductance.

SUMMARY OF THE INVENTION

Briefly stated, the invention provides a novel process useful for fabricating a semiconductor body comprising integrated circuit chips having internal power connections and internal decoupling capacitance means. The process comprises steps of diffusion, including controlled out-diffusion of buried diffusions, into first and second epitaxially grown semiconductor layers. Adjacent regions of different conductivity type, diffused on a substrate, are allowed to out-diffuse together into said first epitaxially grown layer. The said regions of one conductivity type form conductive channels, while the intersection of said adjacent regions and said substrate forms highly conductive junctions for decoupling purposes. Said second layer is epitaxially grown and extensions of said adjacent regions are brought to the surface of said second layer by a series of diffusion steps, also including controlled out-diffusions.

The invention will be described with more particularity with reference to the included drawings, wherein.

Initially, the description will proceed with a brief description of the structure fabricated by the process of the invention.

Figure 1:
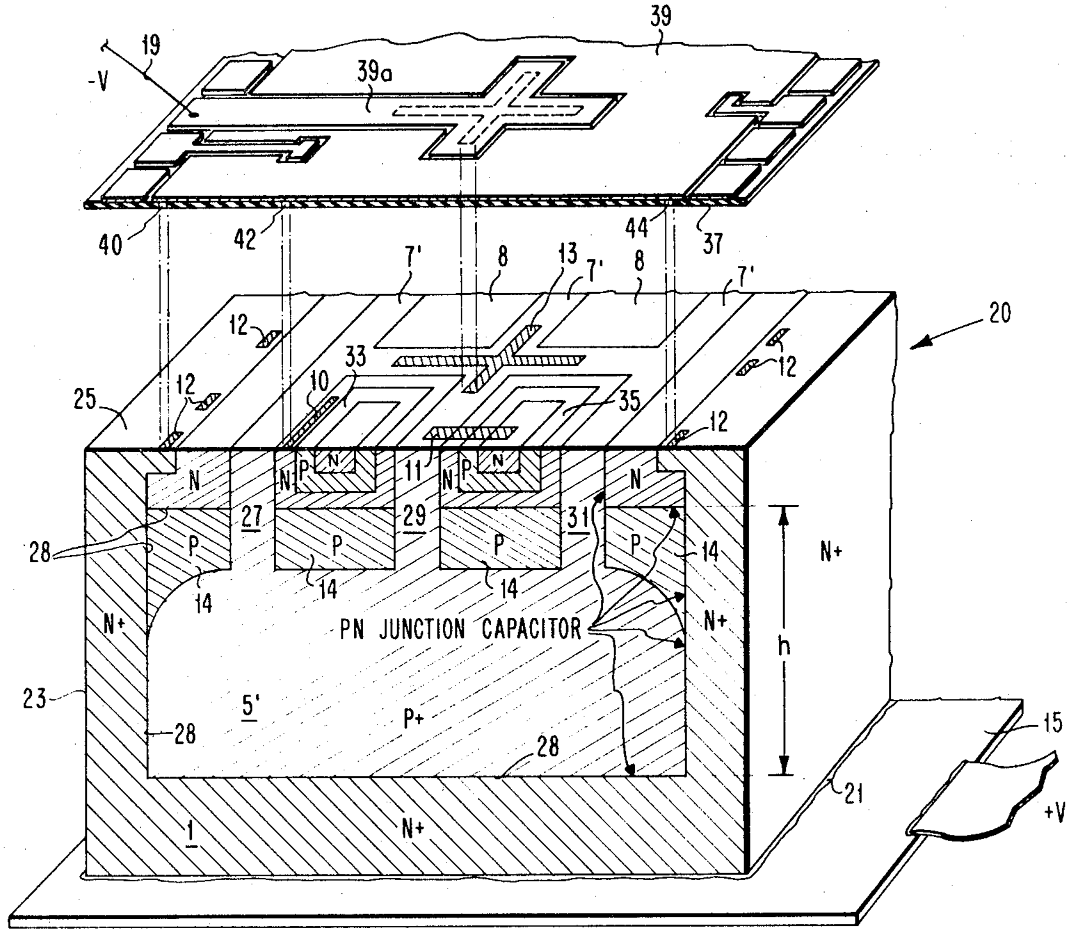
FIG. 1 is a representation of a power connection in an integrated circuit chip fabricated according to the process of this invention.

Referring to FIG. 1, there is seen a power connection in an integrated circuit chip. A structure is shown wherein the lead 15 from a first common power supply, V+, is brought to the surface of an integrated circuit chip, indicated generally at 25, with an absolute minimum series inductance and resistance to obtain a low source impedance at high frequencies. A second power supply V−, is brought onto the chip surface 25 through a lead, 19, having a relatively high series inductance, but decoupled from the first power supply with a capacitor having low series inductance. The capacitor comprises the internal PN junction capacitor indicated at 28 in FIG. 1. Both supplies are then distributed over the chip top surface 25 by a means which does not add significant series inductance or resistance to either supply, as will be subsequently disclosed. The present invention is herein described for NPN transistors in the integrated circuits, which results in the restriction that the power supply with the low inductance connection to the chip be the most positive (V+) voltage. This is to insure a reverse bias voltage on the junction decoupling capacitor. V+ can be any desired voltage including ground potential. A structure, according to the invention, compatible with a low inductance contact to the chip for the most negative power supply (V−) is possible by interchanging the conductivity types in the following discussion in the drawing.

With continued reference to FIG. 1, a first power will be used as a common voltage reference across the semiconductor chip and is indicated generally at V+. Metal contact 15, which may be a conductive metal such as molybdenum, being in the form of a sheet or plane, provides a low resistance and low inductance connection to the entire bottom of an N+ semiconductor substrate 1. The substrate 1 may be, for example, a highly doped silicon semiconductor material having low resistance. Contact between the metal sheet 15 and the substrate 1 is seen generally at 21 and might comprise, for example, a silicon-gold alloy bond, subsequently to be described. A diffused collar bonded by the boundary noted generally at 23, around the perimeter of the chip and internal thereto serves as a low resistance, low inductance collar for providing a conductive path from plate 15 to the top 25 of the semiconductor chip. Also seen in FIG. 1 is a region of diffused highly conductive P+ material 5′ having extensions 27, 29, 31, reaching to the top surface 25 of the semiconductor chip. The second power supply V−, is brought via lead 19 to contact 13 conductively connected to an area of said top surface 25, which area is included in one of the last named extensions. Contact 13 may be a deposited aluminum contact. A PN junction 28 is formed by the intersection of the highly conductive P+ type material 5′, including its extensions 27, 31 the diffused collar, and the substrate. This combination serves as a PN junction capacitor, having a low series inductance, which decouples the V− power supply from the V+ power supply. Thus, although the V− power supply is brought to the surface of the chip through a relatively large inductance 19, it is decoupled from the V+ power supply through a capacitor having a low series inductance.

With continued reference to FIG. 1, circuit elements which may include, but which are not necessarily limited to, NPN transistors are seen generally at 33, 35. These transistors are fabricated on a base of P material 14 of lower conductivity than material 5′. The power supplies which were brought to the surface 25 of the chip 20 are connected to the circuit elements as follows. Deposited metal contacts 11 are used to connect the collector of each transistor, for example, to the selected portion of the top surface 25 to which the V− power supply is connected. Contacts such as 10 are deposited on the emitter of each transistor, for example. An insulator such as silicon dioxide, 37, is deposited over the top surface of the chip. Openings are etched into silicon dioxide 37, coextensive with contacts 10 and with at least a portion of contact 12. A metal plate such as 39 is then deposited on top of the slicon dioxide layer 37. Portion 40 of plate 39 makes contact with the V+ power supply at contact 12, via one of the above-mentioned etched holes in the silicon dioxide. Portions 42, 44 of metal plate 39 connect the V+ supply to contacts 10. Thus the various circuit elements on the top surface 25 of chip 20 have power connected from the V− and V+ power supplies, said power supplies being decoupled by the PN junction capacitor as indicated.

Figure 2:
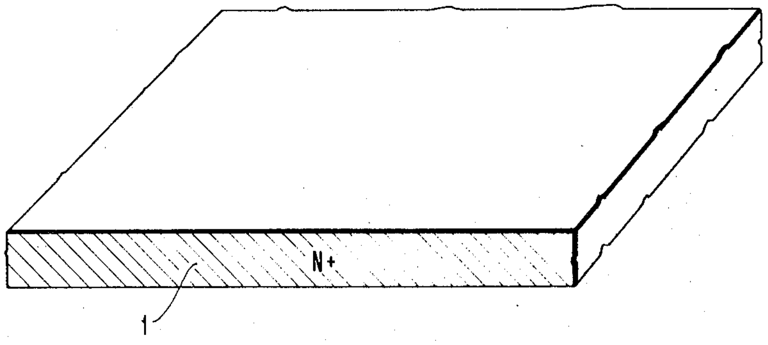
FIGS. 2–13 show the various steps in the process of the invention.
Figure 3:
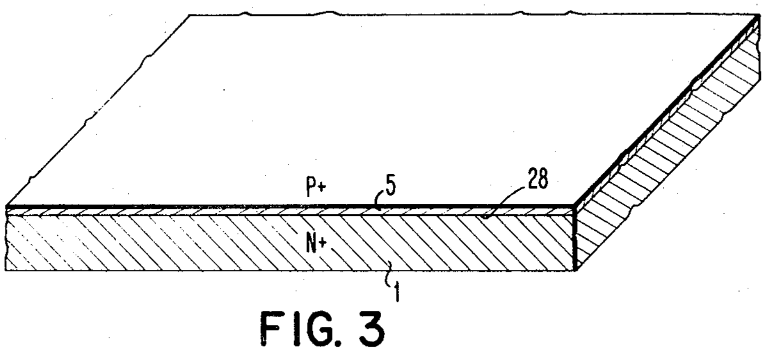

The process which is the subject matter of the present invention will now be described. It will be appreciated by those skilled in the art that the dopants, material thicknesses and material conductivities used in the description are merely illustrative. Various changes can of course be made by those of ordinary skill in the art, without departing from the scope or spirit of the invention. As is well known to those in the integrated circuit art, a large number of chips are normally made from a single wafer and later cut therefrom. In FIG. 2 there is seen a highly conductive N type semiconductor substrate material such as arsenic, doped silicon on which a large number of the above-described chips may be fabricated. The thickness of the substrate can be, for example, from 6 to 8 mils. It is preferred to obtain as high a conductivity as possible for the substrate. With an arsenic dopant it is possible to obtain conductivities in the range of .01 ohm-centimeter. Arsenic is preferred because its low diffusion constant prevents severe degradation of the capacitance of PN junction 28 during subsequent processing.

Diffused into the substrate material 1 is a first high conductivity semiconductor material 5 of a P conductivity type. A suitable dopant for this diffusion may be, for example, boron at a concentration of about $10^{18}$ atoms per cubic centimeter. This diffusion step forms a highly capacitive PN junction 28. Diffusions in this process invention are carried out utilizing well known masking techniques using, for example, silicon dioxide diffusion masks formed by etching through photo-sensitive polymer masks. Since diffusion techniques are well known in the prior art, they will not be discussed further here. However, for more diffusion technique information the reader is referred to the article "A Survey of Diffusion Processes for Fabricating Integrated Circuits" by Duffy and Gnall, in the text Microelectronic Technology, Boston Technical Publishers, 1967, pages 83–92.

Figure 4:
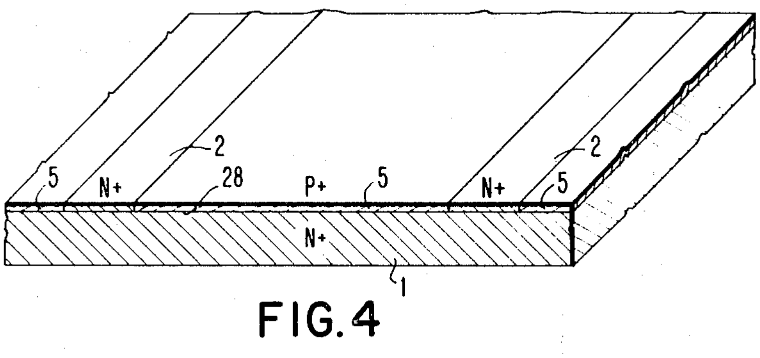

Next, a second highly conductive semiconductor material N+ conductivity type is selectively diffused onto the first highly conductive semiconductive material to form a plurality of first channels such as seen at 2 in FIG. 4. A suitable dopant for this diffusion may be, for example, phosphorous. The conductivity of 2 is comparable to that of substrate 1. Diffusions of channels 2 may be viewed as a cancellation diffusion, to cancel out the effects of P+ diffusion 5 and allow openings, so to speak, of N+ material 2 in the P+ material 5. Thus the plurality of channels 2 will be of the same conductivity type as and continuous with, substrate 1.

Alternately, the same plurality of channels 2 could be achieved by first selectively diffusion channels 2 of N+ conductivity type into substrate 1, and subsequently diffusing P+ material 5 into the substrate 1 in areas between channels 2.

These plurality of channels 2 will contain the boundaries of adjacent integrated circuit chips which will later be cut from the wafer. Only two channels are shown in the interest of drawing clarity, but it will be appreciated that in actual practice many channels 2 will be formed, depending on the number of chips fabricated from a wafer. As will be subsequently seen, vertical first regions will diffuse in portions defined by these first plurality of channels.

Figure 5:
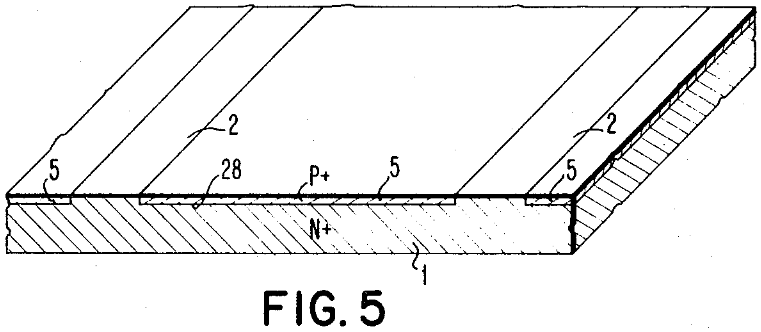
Figure 6:
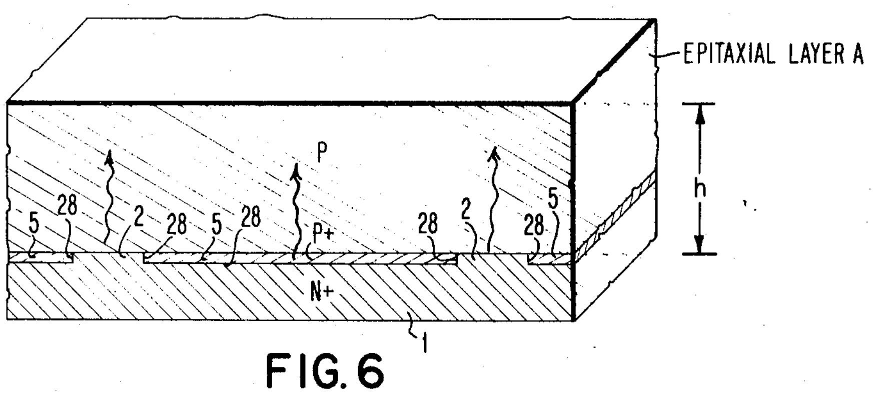

Diffusions 2 and 5 can be classified as buried diffusions. A first epitaxial layer A, seen in FIG. 6. will be grown over layers 2 and 5 such that said layers are, in effect, buried in epitaxial layer A. Layer A can be silicon and is of lower conductivity than layer 5. Several well known epitaxial processes can be used. The silane process is preferred as it allows the growth of higher quality epitaxy at lower temperature. During epitaxial growth of layer A buried diffusions 2 and 5 will concurrently out-diffuse into epitaxial layer A. Thus the layers 2 of FIG. 6 will out-diffuse into part of epitaxial layer A in first regions 2′ defined by the first plurality of channels 2 of FIG. 5.

Concurrently, prediffused layer 5 will also out-diffuse into second regions 5' within epitaxial layer A, between said first regions 2'. Thus, the substrate 1 and the region 2' of FIG. 7 begin to take the form of a diffused collar internal to the semiconductor wafer. Regions 1 and 5' comprise high conductivity regions on either side of PN junction 28, necessary for high performance of the PN junction capacitor.

Figure 8:
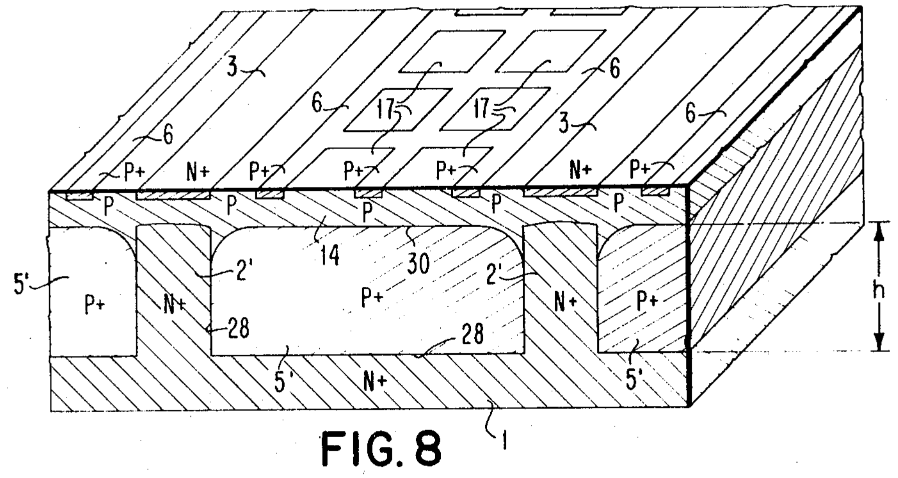
Figure 9:
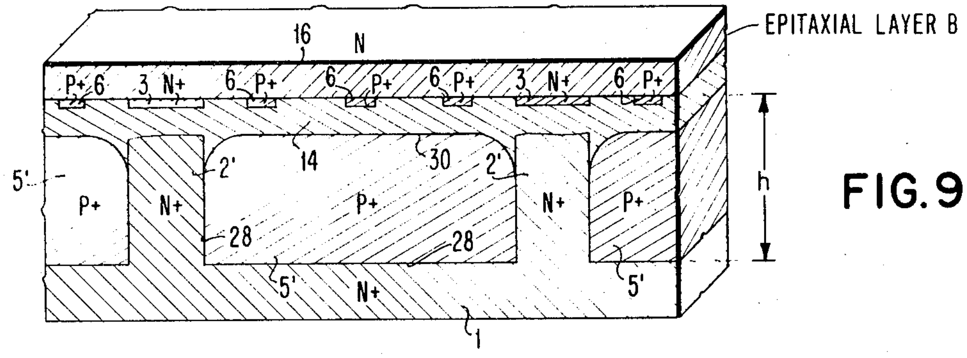

Before proceeding with the next step seen in FIG. 8, it is well to appreciate that a subsequent step will involve the growing of a second epitaxial layer, layer B of FIG. 9, on top of epitaxial layer A. This second epitaxial layer will be used, inter alia, to form the component parts of various circuit elements such as NPN transistors. However, it is necessary to have a fairly low conductivity P region as a base material on which to build these NPN transistors. Therefore, it is necessary to control the height *h* of epitaxial layer A so that P+ regions 5' will not out-diffuse further than the boundary 30 as shown. This insures a low conductivity P region 14 to act as a base for fabricating the NPN transistors. Had the higher conductivity region 5' been allowed to out-diffuse so as to abute the second epitaxial layer, layer B to be subsequently described, low breakdown voltages and lowered circuit speed in the NPN transistors would have resulted. In order to insure the proper out-diffusion of region 5', the height *h* of epitaxial layer A can be, for example, between 10 and 15 microns. A suitable depth of out-diffusion of regions 5' into layer A can be 7 to 8 microns.

Figure 7:
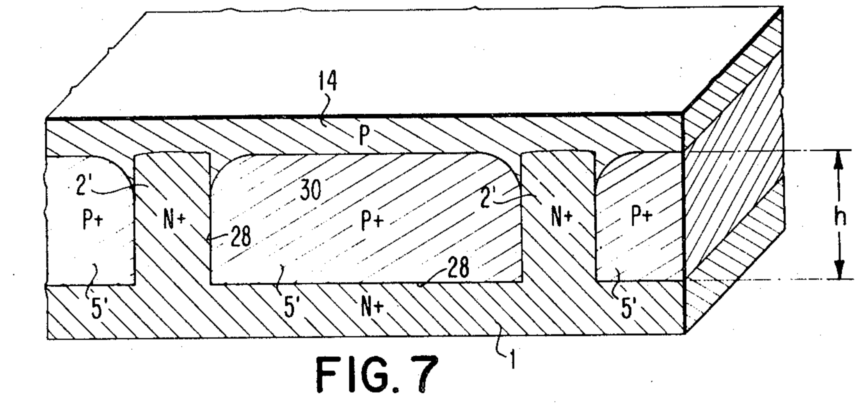

It will be noted that during the out-diffusion process, the regions 2' of FIG. 7 do not out-diffuse completely to the top of epitaxial layer A. However, it is necessary to form a continuous region from regions 2', ultimately to the top surface 25 which will be the top of epitaxial layer B. Moving on, therefore, to the next step, a third highly conductive semiconductor material of N+ conductivity, seen generally at 3 in FIG. 8, is selectively diffused into the top surface of epitaxial layer A, in areas substantially coextensive with the areas of the first plurality of channels which defined the regions 2'. The depth of diffusions 3 can be from 1 to 2 microns. The material for diffusions 3 can be the same as and of comparable conductivity to the material used for diffusions 2. Also, a fourth highly conductive semiconductor material 6, of P+ conductivity is diffused into the surface of epitaxial layer A. The depth of diffusion 6 can be comparable to that of diffusions 3. The material for diffusions 6 can be the same as, and of comparable conductivity to, the material used for diffusions 5. As seen in FIG. 8, this fourth material is diffused in areas defining a second plurality of channels surrounding regions 17 of said epitaxial layer A. These regions 17 will ultimately serve as the material on which integrated circuit materials will be fabricated.

Figure 10:
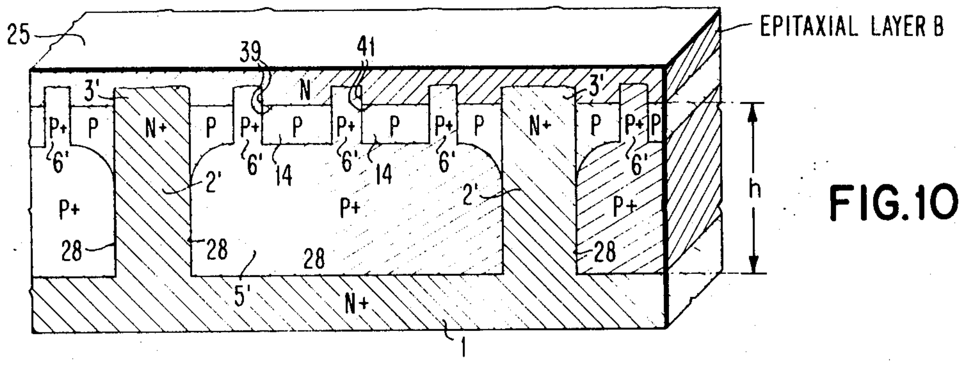

As seen in FIG. 9, a second epitaxial layer, layer B mentioned above, is grown on top of the first epitaxial layer A. This second epitaxial layer can be arsenic doped silicon. During growth of this second epitaxial layer, layers 3 diffuse further into epitaxial layer A and out-diffuse into layer B to form continuous regions 3' with said first regions 2' as seen in FIG. 10. Thus it is seen that the diffused semiconductor collar is brought near to the top surface 25 of the semiconductor wafer. Concurrently, layer 6, originally seen in FIGS. 8 and 9, further diffuse during growth of epitaxial layer B, into epitaxial layer A to form extension 6' of said out-diffused second regions 5'. Diffusions 3 and 6 can be classified as buried diffusions.

Figure 11:
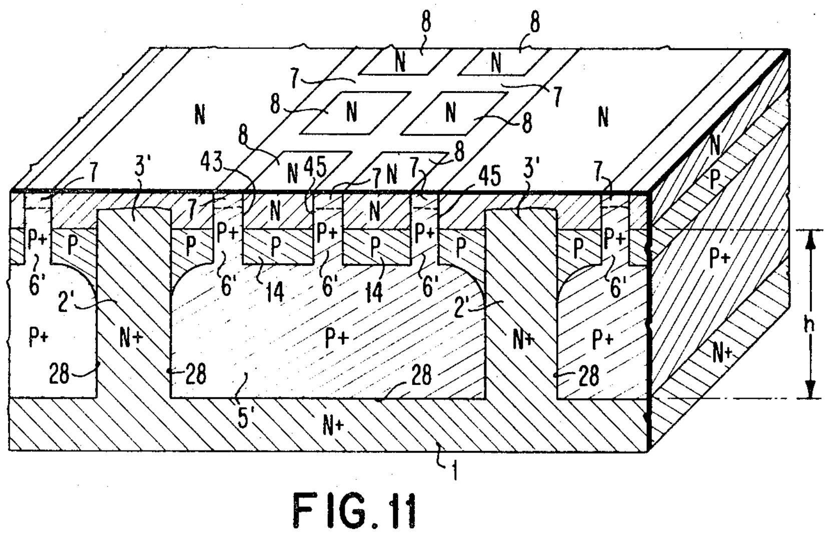

With reference to FIG. 11, a fifth highly conductive semiconductor material 7 is selectively diffused onto the surface of second epitaxial layer B in areas substantially coextensive with those of material 6 in FIG. 8. The material for diffusions 7 can be the same as, and of comparable conductivity to, that of diffusions 6. This material 7 diffuses into epitaxial layer B to make contact between top surface 25 of the wafer and said out-diffused poritons 6' to form PN junctions 43, 45 for electrically isolating regions 8 of epitaxial layer B. Also, diffusions 7 serve to bring the PN junction of the isolation capacitor to the surface 25 to allow passivation thereof. Regions 8 may be used, for example, for fabricating the collectors of NPN transistors on base material 14 of low conductivity P type material, by any process well known in the art. As will be recalled from the description of FIG. 1, P+ portions 7 serve to distribute the V− supply to the circuit elements via metal contacts such as 11. However, with normal diffusions the longitudinal resistance of the channel formed by P+ portions 6 and 7 would be too high for good power supply distribution. However, allowing portions 6 to diffuse into epitaxial layer A to form extensions 6' of out-diffused regions 5', as taught by the invention, has the added result of greatly reducing the effective distribution resistance of the V− supply. Since regions 6' and 7 represent a large portion of a total chip, a very low series resistance and inductance is realized in the V− supply, which is necessary for effective DC and AC power distribution over the chip.

Figure 12:
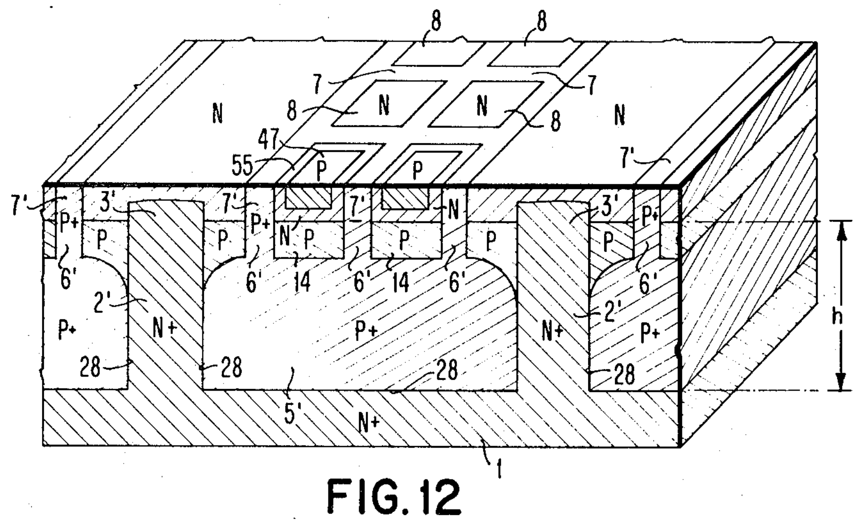
Figure 13:
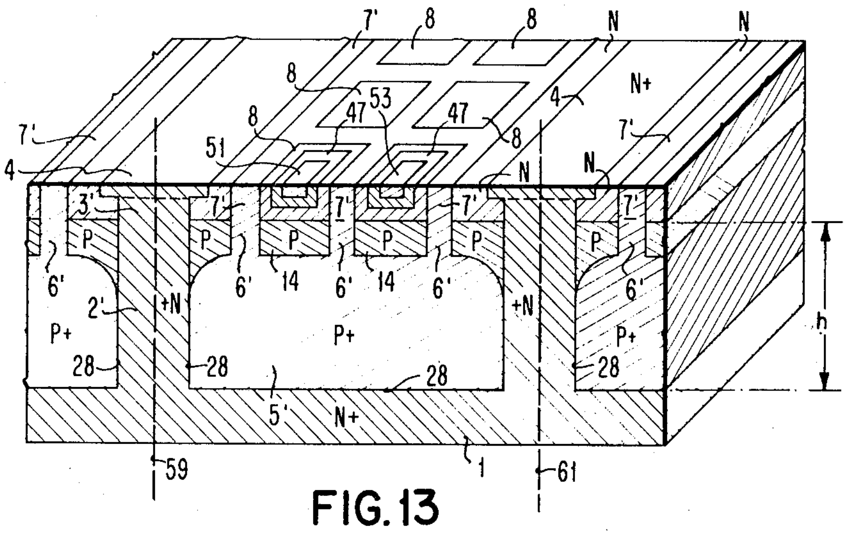

As seen in FIG. 12, portions 55, 57 represent NPN transistor collectors. Bases 47, 49 are diffused into the collectors. In FIG. 13, two final diffusions are made concurrently. These are the diffusions of emitters 51, 53 concurrently with the diffusion of a sixth high conductivity semiconductor material 4 for making low resistance contact between top surface 25 of the second epitaxial layer and the continuous regions 2', 3' of the diffused collar. The material for diffusion 4 can be the same as, and of comparable conductivity to, that of diffusions 3. This last diffusion step of material 4, concurrently with the diffusion of the transistor emitters, allows a low sheet resistance on which metal contact 12 of FIG. 1 will be deposited. This deposition of contacts 12 can be made before cutting the chips from the wafer. Individual integrated circuit chips can be scribed and cut from the wafer along lines such as 59, 61 of FIG. 13. The selectively etched silicon dioxide layer 39 of FIG. 1, and the metal plate 39 can be deposited by any well known deposition technique.

The contact 21 of FIG. 1 might be for example, a silicon-gold alloy bond. One way of achieving such a bond is to gold plate individually the bottom side of the silicon chip and the molybdenum plane 15. The gold plated portions of both the substrate and of the molybdenum plate are placed in contact on a heated surface and ultrasonically vibrated. At a temperature of between 300 to 400 degrees centigrade, the gold against the silicon makes a silicon-gold eutectic, which produces an alloy between the silicon wafer and the gold plating on the molybdenum. This alloy is found to produce a good, void-free, electrical and thermal bond.

While the invention has been particularly shown and described with reference to a preferred embodiment, it will be understood by those skilled in the art that the foregoing and other changes in form and details may be made without departing from the spirit and scope of the invention.

We claim:

1. The process for forming a semiconductor body having power connections displaying low source impedance at high frequencies and a low series inductance, and also having decoupling means displaying high capacitance and a low series inductance, including the steps of:

(a) providing a high conductivity substrate of a first high conductivity type having a top side and a bottom side;

(b) forming in the top side of said substrate a first plurality of diffused channels and forming diffused portions between adjacent ones of said first plurality of channels, said channels being of said first high conductivity type and said diffused portions being of a second high conductivity type;

(c) concurrently growing a first epitaxial layer of said second conductive type on said top side of said substrate and controllably out-diffusing said channels and said portions partly into said first epitaxial layer, the intersections between said channels and said portions and between said substrate and said portions forming highly capacitive junctions;

(d) forming in said first epitaxial layer diffused areas substantially coextensive with said first plurality of channels and of said first high conductivity type;

(e) forming in said first epitaxial layer a second plurality of channels surrounding regions of said first epitaxial layer in areas corresponding to each of said portions, said second plurality of channels being of said second high conductivity type;

(f) concurrently forming a second epitaxial layer of said first high conductivity type on said top surface of said first epitaxial layer while:

(1) controllably diffusing said diffused areas into said first epitaxial layer to contact respective ones of said first plurality of channels to form continuous channels, therewith, (2) controllably diffusing said second plurality of channels into said first epitaxial layer to contact said out-diffused portions to form extension thereof, (3) controllably out-diffusing said diffused areas to extend said continuous channels partially into said second epitaxial layer, and (4) controllably out-diffusing said second plurality of channels to extend said extension partially into said second epitaxial layer;

(g) forming a highly conductive semiconductor path from said extensions to the top surface of said second epitaxial layer to electrically isolate regions in said second epitaxial layer, said highly conductive semiconductor path being of said second high conductivity type;

(h) forming a highly conductive semiconductor path from said continuous channels to said top of said second epitaxial layer, said highly conductive semiconductor path being of the said first high conductivity type; and (i) forming circuit elements in said isolated regions in said second epitaxial layer.

2. The process of claim 1 wherein said circuit elements of step (i) are formed by a series of diffusion steps, and where said highly conductive semiconductor path of step (h) is formed by a diffusion concurrent with the last diffusion in said series of diffusion steps of step (i).

3. The process of claim 1 further including the steps of:

(j) slicing said substrate along selected ones of said continuous channels so as to form an integrated circuit chip having a diffused collar internal to and about the periphery of said chip; and (k) bonding a metallic plate to the bottom of said substrate.

4. The process of claim 1 further including the steps of:

(l) forming conductive contacts between said selected portions of selected ones of said circuit elements and said second plurality of channels on said top of said second epitaxial layer; and (m) forming conductive contacts between said selective portions of selective ones of said circuit elements and said first plurality of channels on said top of said second epitaxial layer.

5. The process of forming a semiconductor body having power connections displaying low source impedance at high frequencies and a low series inductance, and also having decoupling means displaying high capacitance and a low series inductance, including the steps of:

(a) diffusing a first dopant of a first high conductivity type into a highly conductive semiconductive substrate of a second conductivity type to form a highly capacitive junction;

(b) selectively diffusing a second dopant of said second high conductivity type into said substrate to form a plurality of first channels in said substrate and forming discrete areas of said first conductivity type on the surface of said substrate;

(c) growing a first epitaxial layer on the top surface of said substrate, said first epitaxial layer being of said first conductivity type, but less conductive than, said discrete areas and concurrently:

(1) allowing said second dopant to out-diffuse into first regions of said first epitaxial layer defined by said first plurality of channels, and (2) allowing said first dopant to out-diffuse into second regions of said first epitaxial layer defined by said discrete areas;

(d) selectively diffusing a third dopant of said second high conductivity type into the surface of said first epitaxial layer in areas substantially co-extensive with said first regions;

(e) selectively diffusing a fourth dopant of said first high conductivity type into the surface of said first epitaxial layer, in areas defined by said second regions for defining a second plurality of channels surrounding regions of said first epitaxial layer in each of said second regions;

(f) growing a second epitaxial layer on the top surface of said first epitaxial layer, said second epitaxial layer being of said second conductivity type, but less conductive than said substrate, and concurrently:

(1) allowing said third dopant to out-diffuse into said second epitaxial layer and to diffuse into said first epitaxial layer to form continuous channels with said first region, and (2) allowing said fourth dopant to diffuse into said first epitaxial layer to connect with and form extensions of said out-diffused second regions in said first epitaxial layer, and to out-diffuse into said second epitaxial layer to form further extension of said second regions;

(g) selectively diffusing into the surface of said second epitaxial layer a fifth dopant of said first high conductivity type to make contact between said surface of said second epitaxial layer and said extensions of said second region to form electrically isolated regions in said second epitaxial layer; and (h) selectively diffusing into the surface of said second epitaxial layer a sixth dopant of said second high conductivity type for making a low resistant contact between said surface of said epitaxial layer and said continuous channels.

6. The process of claim 1 wherein said substrate comprises arsenic doped silicon.

7. The process of claim 1 wherein said first plurality of channels are formed by a diffusion process using phosphorous as a dopant.

8. The process of claim 1 wherein said diffused portions are formed by a diffusion process using boron as a dopant.

References Cited

UNITED STATES PATENTS

| | | | |
|---|---|---|---|
| 3,327,182 | 6/1967 | Kisinko | 317—235 |
| 3,335,341 | 8/1967 | Lin | 317—235 |
| 3,404,450 | 10/1968 | Karcher | 148—175 |

RICHARD O. DEAN, Primary Examiner

U.S. Cl. X.R.

148—33.3, 33.5, 189, 190, 191

UNITED STATES PATENT OFFICE
CERTIFICATE OF CORRECTION

PATENT NO. : 3,560,277

DATED : February 2, 1971

INVENTOR(S) : Robert H. F. Lloyd, et al

It is certified that error appears in the above-identified patent and that said Letters Patent are hereby corrected as shown below:

In the heading (at col 1, lines 7 et seq), the assign identification should read --assignors to Internation Business Machines Corporation, Armonk, N. Y., a corporation of New York and Motorola Semiconductor Products, Inc., Phoenix, Arizona, a corporation of Illinois, as joint owners.--

Signed and Sealed thi

*ninth* Day of *March 1*

[SEAL]

*Attest:*

RUTH C. MASON
*Attesting Officer*

C. MARSHALL DANN
*Commissioner of Patents and Tradem*